United States Patent
Watson

(10) Patent No.: US 8,344,737 B2
(45) Date of Patent: Jan. 1, 2013

(54) RELAY CIRCUIT TESTER DEVICE

(76) Inventor: Robert Watson, Aline, OK (US)

( * ) Notice: Subject to any disclaimer, the term of this patent is extended or adjusted under 35 U.S.C. 154(b) by 380 days.

(21) Appl. No.: 12/688,639

(22) Filed: Jan. 15, 2010

(65) Prior Publication Data
US 2010/0176830 A1 Jul. 15, 2010

Related U.S. Application Data

(60) Provisional application No. 61/144,912, filed on Jan. 15, 2009.

(51) Int. Cl.
*H01H 31/02* (2006.01)
(52) U.S. Cl. ....... 324/555; 324/556; 324/133; 324/72.5; 340/635
(58) Field of Classification Search .................. None
See application file for complete search history.

(56) References Cited

U.S. PATENT DOCUMENTS

| | | | | | |
|---|---|---|---|---|---|
| 4,027,236 | A | * | 5/1977 | Stewart | 324/556 |
| 4,028,621 | A | * | 6/1977 | Bloxam | 324/556 |
| 4,207,517 | A | * | 6/1980 | Bloxam | 324/556 |
| 4,366,434 | A | * | 12/1982 | Ellis | 324/556 |
| 4,999,574 | A | * | 3/1991 | Stephens | 324/133 |
| 5,030,916 | A | * | 7/1991 | Bokitch | 324/503 |
| 5,270,638 | A | * | 12/1993 | Mellott | 324/133 |
| 5,359,290 | A | * | 10/1994 | Cervas | 324/384 |
| 5,367,250 | A | * | 11/1994 | Whisenand | 324/133 |
| 5,428,294 | A | | 6/1995 | Teel, Jr. | 324/418 |
| 5,430,438 | A | * | 7/1995 | Joos et al. | 340/3.9 |
| 5,635,843 | A | * | 6/1997 | Borland | 324/504 |
| 6,278,919 | B1 | | 8/2001 | Hwang et al. | 701/29 |
| 6,731,217 | B1 | * | 5/2004 | Warner | 340/650 |
| 7,135,851 | B1 | * | 11/2006 | Armstrong et al. | 324/142 |
| 7,859,420 | B2 | * | 12/2010 | Hamilton et al. | 340/635 |
| 2003/0132752 | A1 | | 7/2003 | Johnson et al. | 324/418 |
| 2004/0085071 | A1 | | 5/2004 | Sankey | 324/418 |

* cited by examiner

*Primary Examiner* — Richard Isla Rodas
(74) *Attorney, Agent, or Firm* — L.C. Begin & Associates, PLLC

(57) ABSTRACT

A circuit tester device for testing continuity and polarity of vehicle relay circuits may include a housing and a plug carried by the housing. The circuit tester device may also have a battery lead adapted to connect to a battery terminal, and a ground lead adapted to connect to a ground. Further, the circuit tester device may have circuitry including three or more circuits connected between the battery and ground leads. Each circuit may have in series a first resistor, a first status indicator, a first diode, a test terminal, a second diode, a second status indicator and a second resistor. Each test terminal may be connected to a respective one of the pins. The circuitry may also have one or more load circuits tapped into one of the circuits between the first and second diodes. The load circuits may include in series a test switch and a load terminal.

16 Claims, 6 Drawing Sheets

RELAY CIRCUIT TESTER DEVICE

CROSS-REFERENCE TO RELATED APPLICATIONS

This application claims the benefit of U.S. Provisional Application Ser. No. 61/144,912 filed on Jan. 15, 2009.

FIELD OF THE DISCLOSURE

The present disclosure relates generally to vehicle relay circuits, and more particularly, to a relay circuit tester device that may test continuity of multiple vehicle relay circuits simultaneously.

BACKGROUND OF THE INVENTION

A vehicle system may include vehicle relay circuitry having separate circuits that are connected to a relay socket adapted to receive a relay at a relay box. The continuity of each circuit may be individually tested by using a multi-meter or a test probe light. However, this is a somewhat time consuming process for determining the continuity of the entire relay circuit. In addition, the relay socket may have generally small dimensions such that it may be cumbersome to contact the multi-meter lead or test light lead with the circuit.

SUMMARY OF THE INVENTION

One embodiment of a circuit tester device ("device") for testing continuity and polarity of vehicle relay circuits, which may be coupled to a relay socket having a plurality of receptacle terminals, may include a housing and a plug carried by the housing. The plug may include a plurality of pins, each pin being adapted to connect to a respective one of the receptacle terminals of the relay socket. The device may also have a battery lead carried by the housing and adapted to connect to a battery terminal. In addition, the device may have a ground lead carried by the housing and adapted to connect to a ground. Further, the device may have circuitry that may be mounted within the housing and include three or more circuits connected between the battery lead and the ground lead. Each circuit may have in series a first resistor, a first light emitting diode, a first diode, a second diode, a second light emitting diode and a second resistor. Further, each circuit may have a test terminal, which may be coupled between the first and second diodes and further connected to a respective one of the three pins. The circuitry may also include one or more load circuits tapped into one of the circuits between the first and second diodes. Each load circuit may have in series a test switch and a load terminal connected to a respective one of the other pins.

Another embodiment of a device for testing continuity and polarity of vehicle relay circuits, which may be coupled to a relay socket having a plurality of receptacle terminals, may include a housing. The device may also have a battery lead carried by the housing and adapted to connect to a battery terminal. In addition, the device may have a ground lead carried by the housing and adapted to connect to a ground. Further, the device may also have a pair of input voltage circuits carried by the housing and connected between the battery lead and the ground lead. Each input voltage circuit may have an input test terminal adapted to connect to a respective one of the receptacle terminals of the relay socket to receive an input voltage therefrom. The device may also have a ground circuit carried by the housing and connected between the battery lead and the ground lead. The ground circuit may have a first ground test terminal adapted to be coupled to a vehicle circuit that has in series a vehicle switch and the ground. The device may also have one or more load circuits carried by the housing and connected between the battery lead and the ground lead. Each of the load circuits may have in series a test switch and a second ground test terminal adapted to be coupled to other vehicle circuits.

An embodiment of a method for operating a device to test continuity and polarity of vehicle relay circuitry may include connecting a battery lead of the device to a voltage source of a vehicle. The method may also include connecting a ground lead of the device to a ground. In addition, the method may include inserting a plug of the device into a relay socket. Further, the method may include operating a vehicle switch of a vehicle system coupled to the relay socket. The method may also include operating a test switch of the device to actuate the vehicle system. The method may further include energizing a plurality of status indicators of the device in response to connecting the battery lead to the voltage source, connecting the ground lead to the ground, operating the vehicle switch and operating the test switch.

BRIEF DESCRIPTION OF THE DRAWINGS

The advantages and features of the present disclosure will become better understood with reference to the detailed description taken in conjunction with the accompanying drawings, in which.

Like reference numerals refer to like parts throughout the description of several views of the drawings.

DETAILED DESCRIPTION

Exemplary modes for carrying out the disclosure are presented and depicted in FIGS. 1 to 7. The exemplary embodiments described herein provide detail for illustrative purposes only and are subject to many variations. It is understood that various omissions and substitutions of equivalents are contemplated as circumstances may suggest or render expedient, but are intended to cover the application or implementation without departing from the spirit or scope of the present disclosure.

Figure 1:
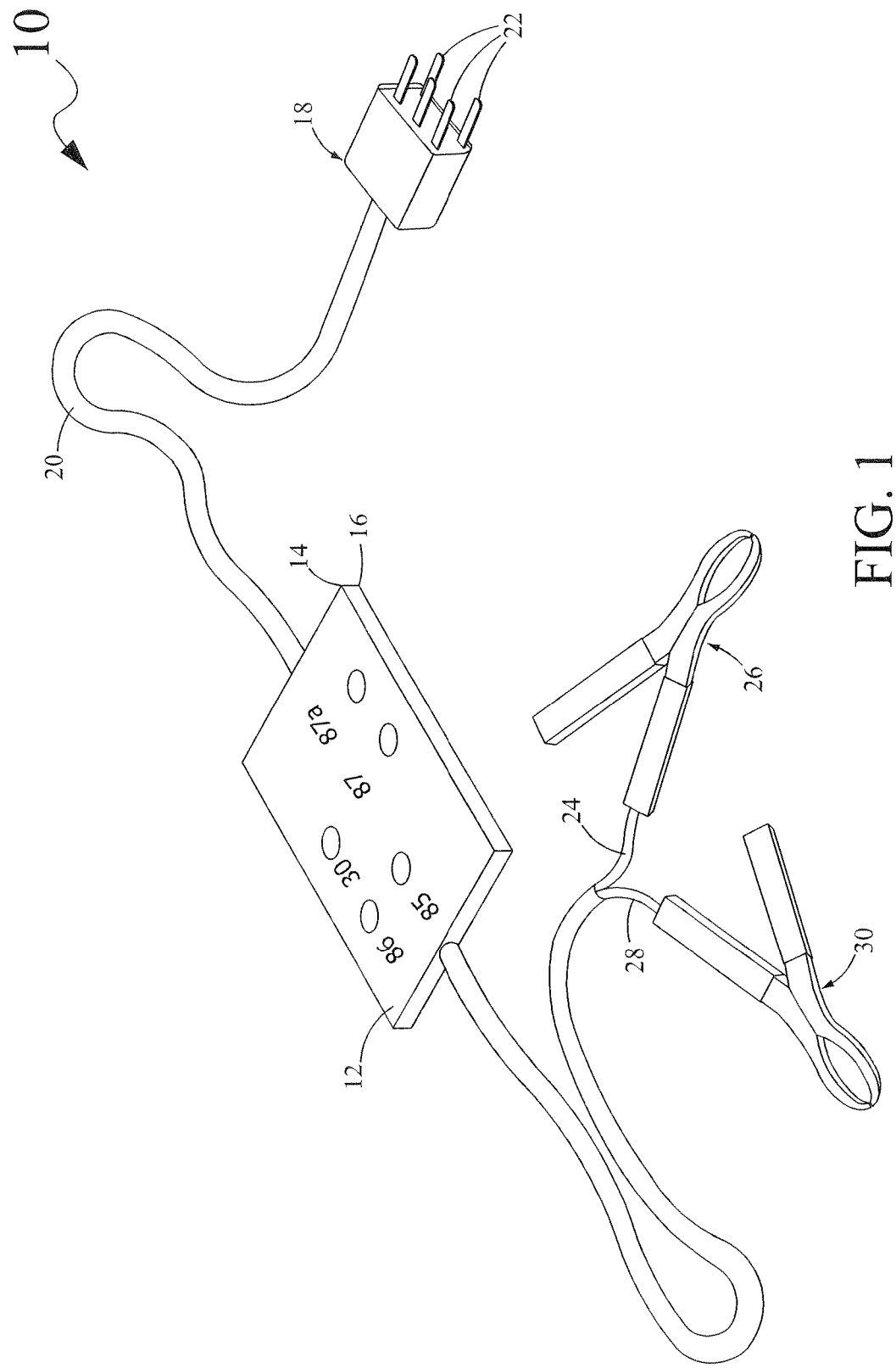
FIG. 1 is a perspective view of one embodiment of a relay circuit tester device having a housing and a plug carried by the housing.
Figure 2:
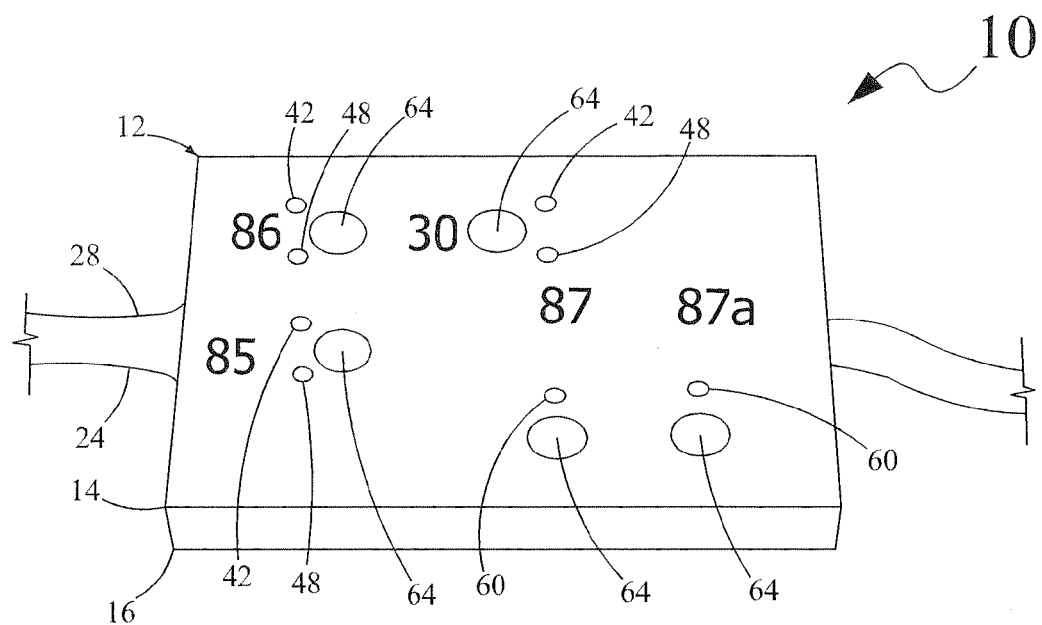
FIG. 2 is an enlarged view of the housing of FIG. 1, illustrating the device having a plurality of posts extending therefrom to permit a multi-meter lead or a test light lead to access the vehicle relay circuits.

Referring to FIGS. 1 and 2, one embodiment of a circuit tester device 10 may include a housing 12 or casing, which in this form may have a first portion 14 and a second portion 16 attached to the first portion 14 to define a cavity (not shown) therebetween. The housing 12 may have two or more portions attached by together by any suitable fastener or may instead be a single-piece body.

Figure 3:
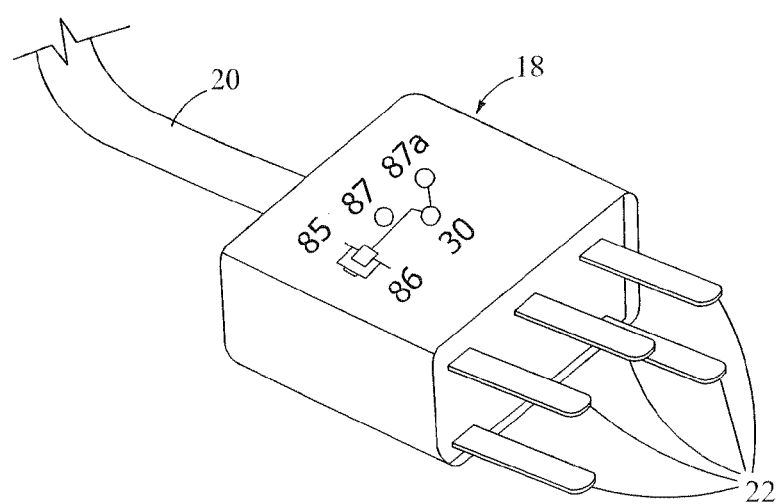
FIG. 3 is an enlarged view of the plug of FIG. 1.

Referring to FIGS. 1 and 3, the circuit tester device 10 may also include a plug 18 carried by the housing 12. By way of example, the circuit tester device 10 may have a cord 20 that includes one end fixedly coupled to the plug 18 and another end fixedly coupled to the housing 12. Of course, one end of the cord in another form may instead be coupled to a retraction mechanism (not shown) disposed within the cavity of the housing rather than being fixedly coupled to the housing. In addition, the plug in still another form may extend directly from the housing. Also, the plug in yet another form may be one of a plurality of plugs each having its own distinct pin configuration and configured to be releasably connected to the cord, such that the device may be used for a variety of relay circuits. The plug 18 may have a plurality of pins 22 that may be arranged in a suitable pattern for mating with a corresponding socket adapted to be used for relay circuitry. For example, the plug 18 may include five pins 22 arranged in a standard 5-pin ISO relay configuration for vehicle relay receptacle terminals 85, 86, 30, 87 and 87a. However, the plug may instead include any number of pins arranged in any pattern. As seen in FIG. 3, a legend may be applied to a surface of the plug 18 denoting the plug pin connections to the corresponding relay circuit receptacle terminals.

Figure 4:
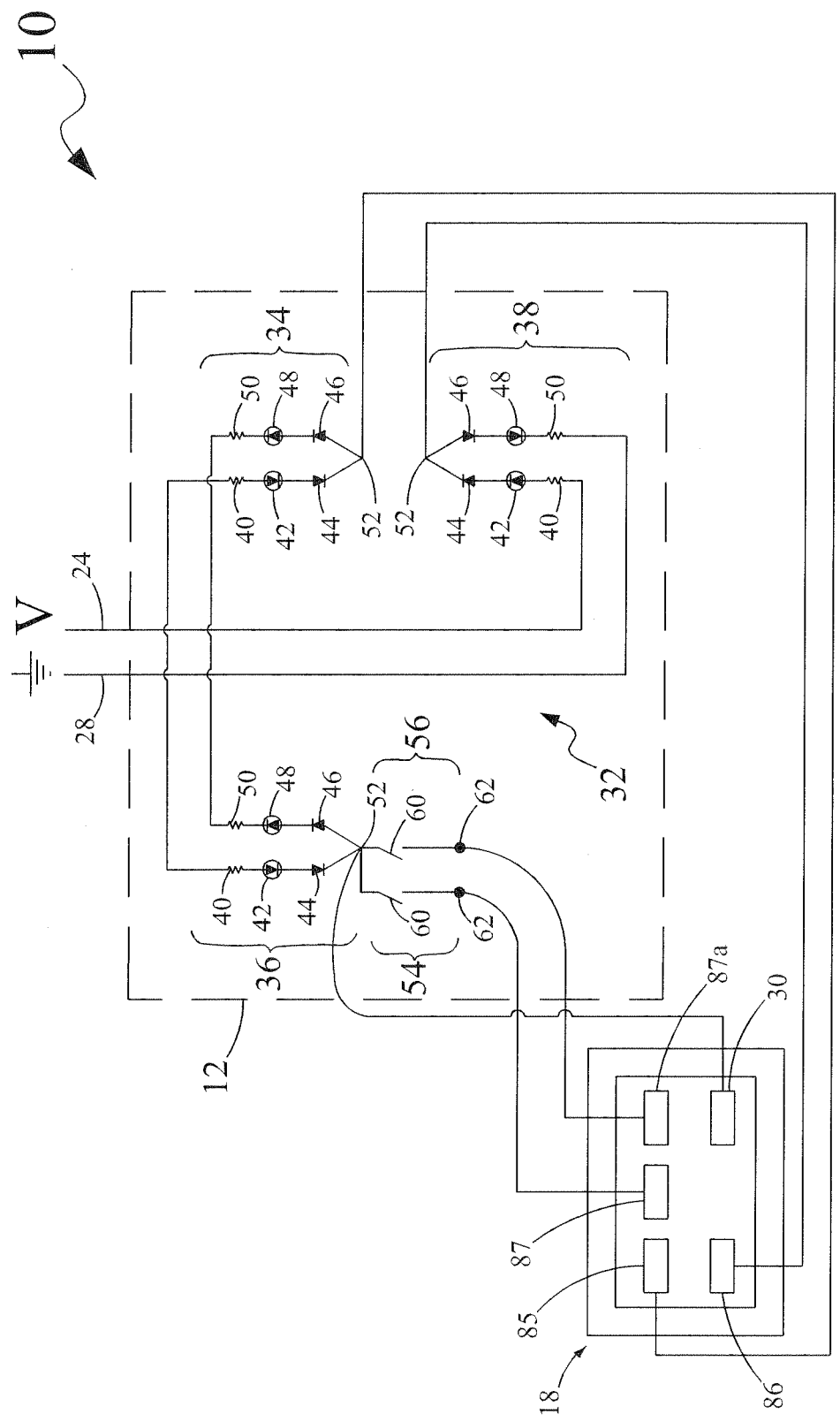
FIG. 4 is a circuit diagram of the device of FIG. 1.

Referring to FIGS. 1, 3 and 4, the circuit tester device 10 may also include a battery lead 24 that may extend from the housing and terminate with an alligator clip 26. Similarly, the circuit tester device may also have a ground lead 28 that may be carried by the housing 12 and terminate with another alligator clip 30. FIG. 4 also shows schematically the connections between the test terminals 52 in the test device 10 and the corresponding pins in plug 18 which are mateable with complementary receptacle terminals in the relay socket.

As shown in FIG. 4, the circuit tester device 10 may also include circuitry 32 carried by the housing 12 within, for example, the cavity of the housing 12. The circuitry 32 may include three or more circuits 34, 36, 38 connected between the battery lead 24 and the ground lead 28. In one embodiment, the circuitry 32 includes two input voltage test circuits 34, 36 and a ground test circuit 38. Each circuit may include in series a first resistor 40, a first status indicator (LED) 42, a first diode 44, a second diode 46, a second status indicator 48 and a second resistor 50. In one embodiment, one or more of status indicators 42 and 48 are in the form of light emitting diodes. However, it will be appreciated that types of status indicators other than LED's may be employed to indicate the continuity (or lack thereof) of portions of the relay circuit. For example, auditory, tactile, and/or alternative visual signaling means may be incorporated into the testing circuit, either singly or in combination, for conveying the continuity test results to a user.

In an embodiment where one or more of status indicators 42 and 48 are in the form of light emitting diodes, the first light emitting diodes in one form may be configured to emit green light, and the second light emitting diodes in one form may be configured to emit red light. However, the first and second light emitting diodes may be configured to emit any suitable color of light or combination thereof. Further, each circuit may include a test terminal 52, which may be coupled between the first and second diodes 44, 46 and further connected to a respective one of three plug pins 22. For example, the input voltage test circuit 34 may include an input test terminal 52, which may be coupled between the first and second diodes 44, 46 and further connected to the plug pin 22 mateable with relay receptacle terminal 85. In addition, the input voltage test circuit 36 may include an input test terminal 52, which may be coupled between the first and second diodes 44, 46 and further connected to the plug pin 22 mateable with relay receptacle terminal 30. The ground test circuit 38 may include a first ground test terminal 52, which may be coupled between the first and second diodes 44, 46 and further connected to the plug pin 22 mateable with relay receptacle terminal 86. Input circuits 34, 36 and 38 discriminate the polarity of the relay circuits in to which they are connected at test terminals 52.

The circuitry 32 may also have two load circuits 54, 56, that are tapped into the input voltage test circuit 36 at the test terminal 52 between the first and second diodes 44, 46. Of course, the circuitry may have more or less than two load circuits coupled to the test terminal 52 of the input voltage test circuit 36. Each load circuit may have in series a test switch 60 and a test terminal 62 or load terminal adapted to be coupled to one or more other vehicle circuits (not shown), such as a vehicle horn circuitry that may terminate with a ground. Each of the test terminals 62 in this for in may be connected to a respective one of the plug pins 22 mateable with relay receptacle terminal 87 and relay receptacle terminal 87a. In one embodiment, each of terminals 62 is connected to terminal 52 of circuit 36 via a user-controlled, push style, normally open switch. Thus, when either an applied voltage or ground is present at test terminal 52 of circuit 36, a user may "jumper" the voltage (or ground) by engaging the switch (or switches) 60 to the vehicle outputs through terminals 62, thereby enabling testing of the connected vehicle circuit.

As best shown in FIGS. 2 and 4, the circuitry 32 may also include a plurality of posts 64 electrically coupled to and extending from a respective one of the test terminals 52 through holes in the housing, to permit a multi-meter lead or test light lead to access the circuit and measure amperage or voltage at the test terminal.

Figure 5:
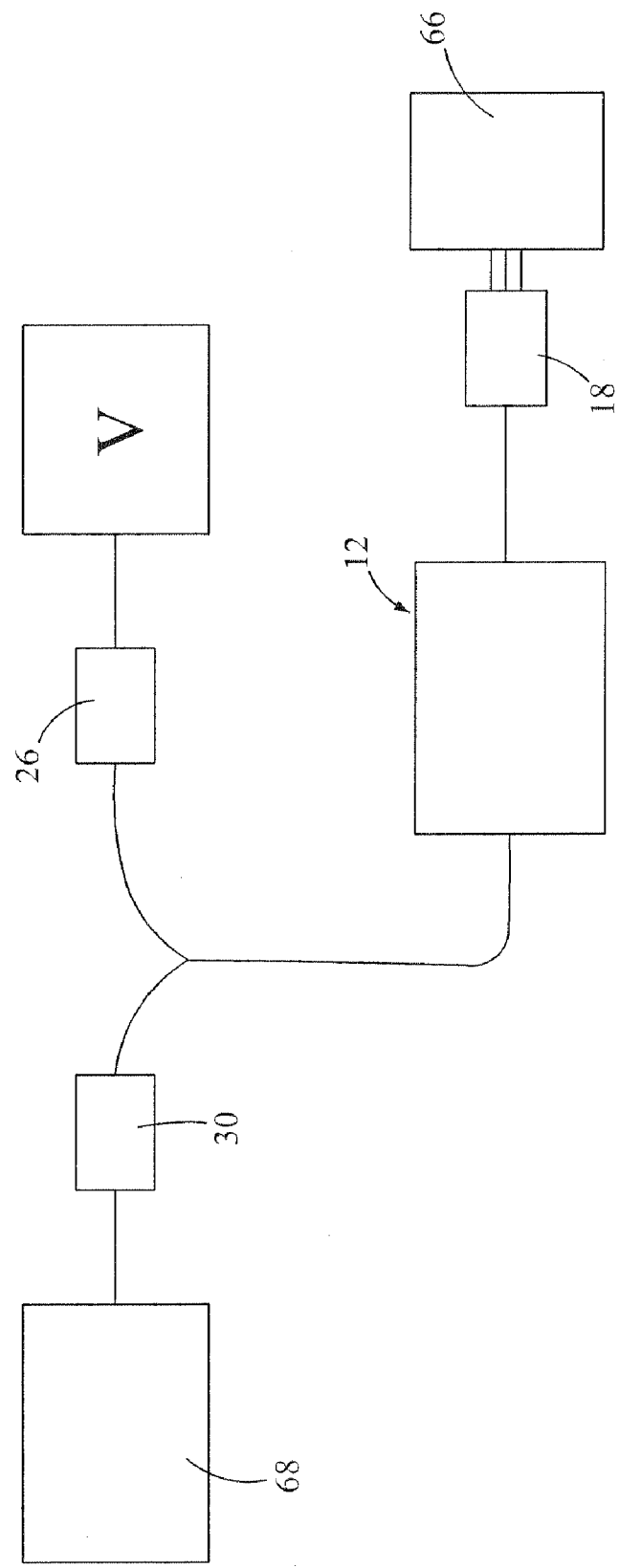
FIG. 5 is a perspective view of the device of FIG. 1, illustrating the device diagnosing continuity of vehicle relay circuitry.

Operation of an embodiment of the present invention employing light emitting diodes as circuit status indicators will now be discussed. In use, as schematically shown in FIGS. 4 and 5, the alligator clip 26 may be attached to a 12V battery terminal or other voltage source designated V having a first polarity, and the alligator clip 30 may be attached to ground 68, such as a vehicle chassis. When the tester is connected to 12 volts through lead 24 and to ground through terminal 28, current flow is permitted through circuits 34, 36 and 38. Current travels from 24, through resister 40, illuminates LED 42, travels through diode 44, test terminal 52, diode 46 and illuminates LED 48, then passes through resister 50 and returns to ground via lead 28. Accordingly, the first and second light emitting diodes 42, 48 of the two input voltage circuits 34, 36 and the ground circuit 38 may be energized to emit light. Further, the plug 18 may be coupled to a relay socket (not shown) for any suitable relay circuit, thereby connecting the two input voltage circuits 34, 36 and the ground circuits 38, 54, 56 to a respective one of vehicle relay circuits (not shown) of the vehicle system.

By way of one example, a vehicle horn system (not shown) may have vehicle circuits including control input voltage circuitry adapted to supply voltage of a second polarity from a fuse voltage source to the test terminal 52 of the input voltage circuit 34. When a vehicle relay circuit is connected to the test circuit at one or more of test terminals 52, both of LED's 42 and 48 will be illuminated both when there no voltage applied to the test circuit at the test terminal 52 and also when there is no continuity to ground at test terminal 52. Similarly, if the vehicle relay circuit connected to the test terminal 52 is an open circuit, both LEDs will remain illuminated.

The second polarity may be opposite to the first polarity of the battery terminal V, thereby de-energizing the first light emitting diode 42 of the input voltage circuit 34 and indicating continuity of the control input voltage circuitry. That is, if terminal 52 is supplied with 12 volts from the vehicle, LED 42 will no longer be illuminated due to the fact the each side of the LED is at 12 volts. Thus, there is no potential difference across LED 42 current flow through the LED ceases. Because a voltage is applied at test terminal 52, current flow will continue through diode 46, LED 48, resistor 50 and returning to ground via ground lead 28. If, however, the first light emitting diode 42 is not de-energized, this may indicate that the opposite polarity voltage is not being applied by the relay circuit to test terminal 52 of the input voltage circuit 34. This may indicate an open circuit condition or other faulty condition in the control input voltage circuitry. During normal operation of the vehicle, the voltage source may be coupled to a coil (not shown) or other control portion of a relay (not shown). Further, the vehicle circuits in this form may also include vehicle switch circuitry (not shown) that may be coupled to the test terminal 52 of the ground circuit 38. The vehicle switch circuitry may include in series a vehicle switch and a ground, such that closing the switch de-energizes the second light emitting diode 48 of the ground circuit 38 and indicates continuity of the vehicle switch circuitry. If, on the other hand, the second light emitting diode 48 of the ground circuit 38 is not de-energized when the switch is closed, then the device 10 may indicate an open circuit condition or other faulty condition for the vehicle switch circuitry. Alternatively, the vehicle switch circuitry may include in series a vehicle switch and a ground, such that opening the switch de-energizes the second light emitting diode 48 of the ground circuit 38 and indicates continuity of the vehicle switch circuitry.

If continuity to ground is present from the vehicles circuitry connected at terminal 52, LED 48 will no longer be illuminated since both sides of the LED are at ground potential; therefore, there is no current flow across the LED. Current flow will still flow through LED 42, leaving it illuminated. Current will flow from battery lead 24, through resister 40, LED 42, diode 44, and terminal 52, and will complete the circuit to ground via the vehicles circuitry connected to test terminal 52.

During normal operation of the vehicle, the vehicle switch circuitry may be coupled to an end of the relay coil opposite to the control input voltage circuitry. In this respect, the vehicle switch may be closed to energize the coil of the relay and generate an electromagnetic field. In addition, the vehicle circuits in this form may include load input voltage circuitry having a voltage source coupled to the test terminal 52 of the input voltage circuit 36. This voltage source may have a second polarity that is opposite to the first polarity of the battery terminal thereby de-energizing the first light emitting diode 42 of the input voltage test circuit 36. However, if the first light emitting diode 42 of the input voltage circuit 36 is not de-energized, then this may indicate that the opposite polarity voltage is not being applied by the relay circuit to test terminal 52 of the input voltage circuit 34. This may indicate an open circuit condition or other faulty condition for the load input voltage circuitry.

During normal operation of the vehicle, the load input voltage circuitry may be coupled to a normally open switch (not shown) or a normally closed switch (not shown) of the relay, which may close or open in response to the electromagnetic field generated by the relay coil. The vehicle circuits may include one or more vehicle load circuits coupled to a respective one of the ground circuits 54, 56 or load circuits. The test switches 60 of the ground circuits 54, 56 may be closed to actuate the vehicle system thereby indicating continuity of the vehicle load circuits. If, however, any of the closed test switches 60 do not actuate the vehicle load circuits, then the device 10 may indicate an open circuit condition or faulty circuit condition of the respective vehicle load circuit.

Of course, the vehicle switches and test switches may be configured to open or close for energizing or denergizing any combination of light emitting diodes. For example, the vehicle switches and test circuit may be configured so that the first light emitting diode is energized in response to the battery lead being connected to the battery terminal and further in response to the test terminal being connected to a vehicle circuit having in series an open vehicle switch and a ground. Alternatively, the vehicle switches and test circuit may be configured so that the first light emitting diode is energized in response to the battery lead being connected to the battery terminal and further in response to the test terminal being connected to a vehicle circuit having in series a closed vehicle switch and a ground.

The circuit tester device may be advantageous for permitting a technician to apply a multi-meter to any test terminal for measuring circuit voltage drop of the respective circuit and its components. Further, the technician may connect his multi-meter in series with the vehicle relay circuit and circuit tester device to measure amperage of the vehicle relay circuit.

Figure 6:
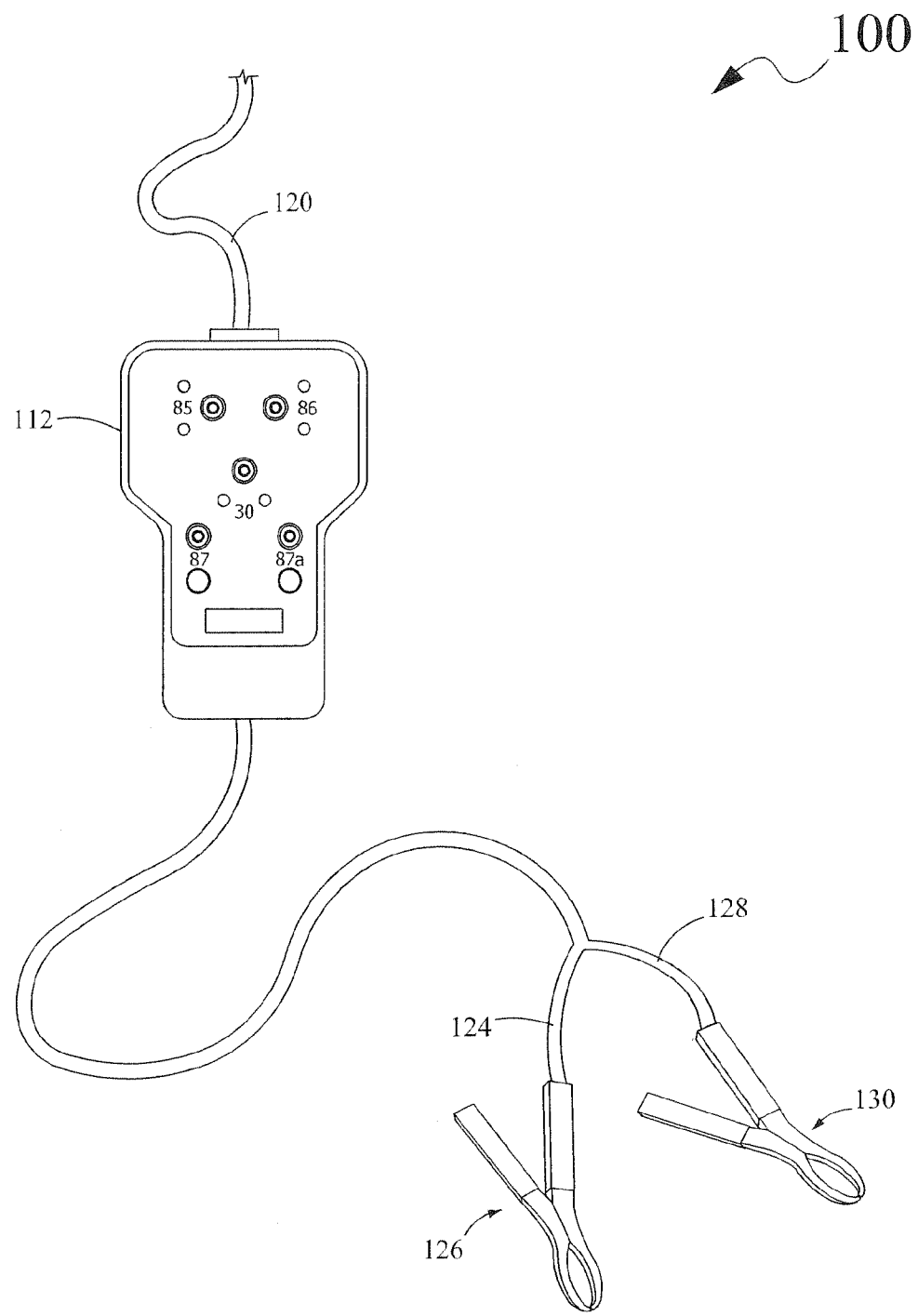
FIG. 6 is a perspective view of another embodiment of a relay circuit tester device, illustrating the device having a plurality of sleeves to permit a multi-meter lead or a test light lead to access the vehicle relay circuit.
Figure 7:
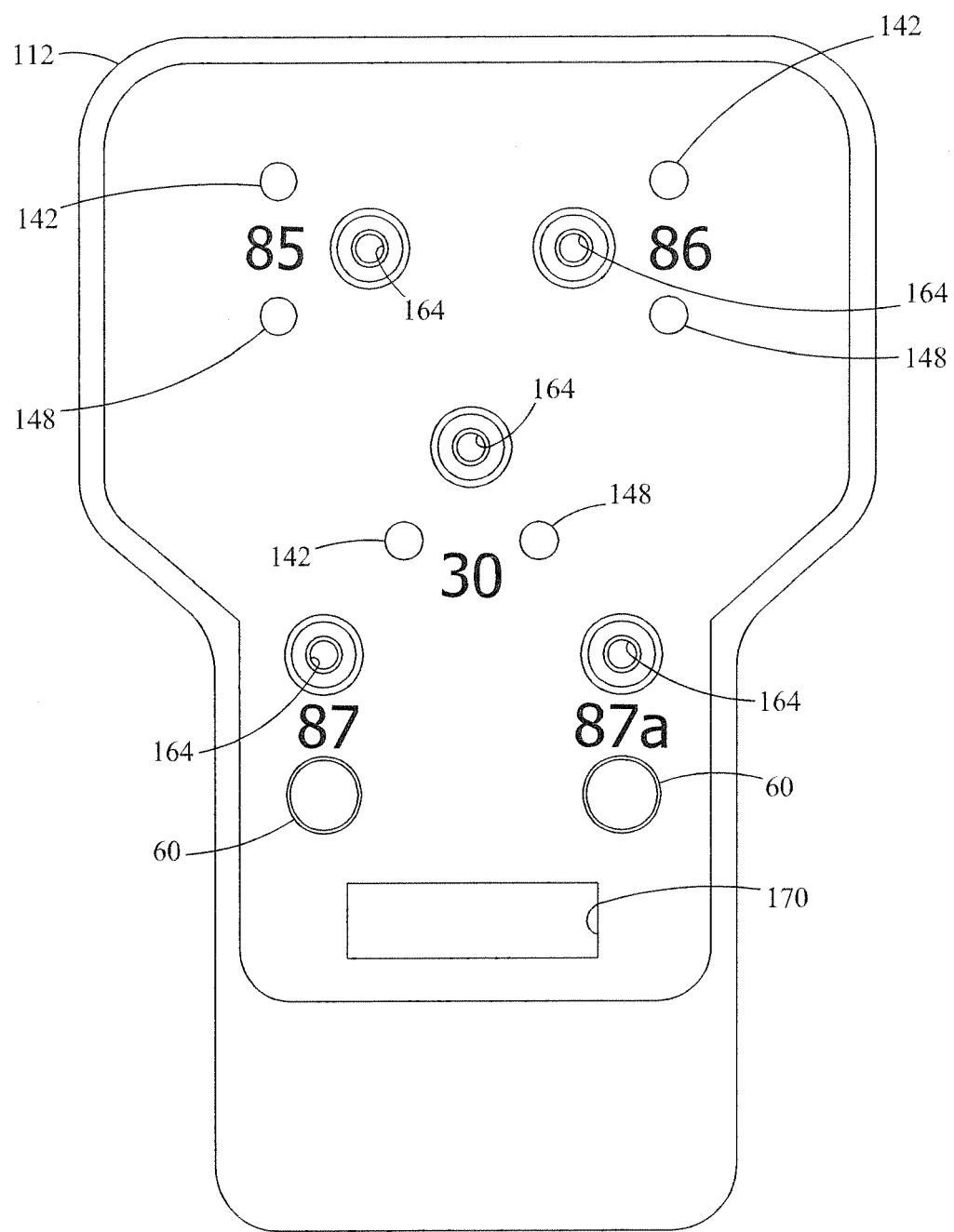
FIG. 7 is a plan view of a housing containing the test circuitry of the device shown in FIG. 6.

Referring to FIGS. 6 and 7, another embodiment of a circuit tester device 100 having test terminals 152 may be substantially similar to the circuit tester device 10 of FIGS. 2 and 4 having the test terminals 52. However, the circuit tester device 100 may have a sleeve 164 connected to and extending from a respective one of the test terminals 152, as compared to the circuit tester device 10 having the plurality of posts 64 extending from respective ones of the test terminals 52. These sleeves may be configured to receive therein and engage a probe or complementary pin, as an alternative to manually engaging posts 64 with a test probe or other device. In addition, the housing 112 may also include a recessed surface 170 configured to receive, for example, an identification label.

The relay circuit tester device may be advantageous for testing continuity of multiple vehicle circuits at a central location, such as the relay, thereby significantly reducing the amount of time for such testing. In addition, the tester may immediately indicate the polarity of two or more vehicle circuits. Further, the tester may permit meter leads or test light probes to communicate with the relay circuit, while such leads and probes could not access terminals within conventional relay boxes.

It will be understood that the foregoing descriptions of embodiments of the present invention are for illustrative purposes only. As such, the various structural and operational features disclosed herein are susceptible to a number of modifications commensurate with the abilities of one of ordinary skill in the art, none of which departs from the scope of the present invention as defined in the appended claims.

What is claimed is:

1. A circuit tester device for testing continuity and polarity of vehicle relay circuits coupled to a relay socket, the circuit tester device comprising:
a housing;
a plug extending from the housing, the plug including a plurality of pins each pin being adapted to electrically connect to a respective one of a plurality of receptacle terminals of a relay socket;
a battery lead carried by the housing and adapted to connect to a battery terminal;
a ground lead carried by the housing and adapted to connect to a ground; and
a circuitry mounted within the housing and including at least three circuits connected between the battery lead and the ground lead, each of the at least three circuits including in series a first resistor, a first status indicator, a first diode, a second diode, a second status indicator and a second resistor, each of the at least three circuits further including a test terminal that is coupled between the first and second diodes and further connected to a respective one of the at least three of the pins, wherein the circuitry further includes at least one load circuit tapped into one of the at least three circuits between the first and second diodes, the at least one load circuit including in series a test switch and a load terminal connected to a respective one of the other pins.

2. The circuit tester device of claim 1, wherein the battery terminal has a first polarity, and the first status indicator is energized in response to the battery lead being connected to the battery terminal, and at least one of the three circuits is energized thereby.

3. The circuit tester device of claim 1, wherein the battery terminal has a first polarity, and the first status indicator is de-energized in response to the battery lead being connected to the battery terminal and further in response to application to the test terminal of a voltage having a second polarity opposite to the first polarity when the plug is connected to the relay socket, and at least one of the three circuits is de-energized thereby.

4. The circuit tester device of claim 1, wherein the battery terminal has a first polarity, and the second status indicator is energized in response to the battery lead being connected to the battery terminal and further in response to application to the test terminal of a voltage having a second polarity opposite to the first polarity when the plug is connected to the relay socket, and at least one of the three circuits is energized thereby.

5. The circuit tester device of claim 1, wherein the first light emitting diode is energized in response to the battery lead being connected to the battery terminal and further in response to the test terminal being connected to a vehicle circuit having in series an open vehicle switch and a ground, and at least one of the three circuits is energized thereby.

6. The circuit tester device of claim 1, wherein the first light emitting diode is energized in response to the battery lead being connected to the battery terminal and further in response to the test terminal being connected to a vehicle circuit having in series a closed vehicle switch and a ground, and at least one of the three circuits is energized thereby.

7. The circuit tester device of claim 1, wherein the second light emitting diode is energized in response to the battery lead being connected to the battery terminal and further in response to the test terminal being connected to a vehicle circuit having in series an open vehicle switch and a ground, and at least one of the three circuits is energized thereby.

8. The circuit tester device of claim 1, wherein the second light emitting diode is de-energized in response to the battery lead being connected to the battery terminal and further in response to the test terminal being connected to a vehicle circuit having in series a closed vehicle switch and a ground, and at least one of the three circuits is de-energized thereby.

9. The circuit tester device of claim 1, wherein each of the battery lead and the ground lead terminate with a respective one of a pair of alligator clips.

10. The circuit tester device of claim 1, wherein the test switch is a push button switch.

11. The circuit tester device of claim 1 wherein the first status indicator comprises a light emitting diode.

12. The circuit tester device of claim 1 wherein the second status indicator comprises a light emitting diode.

13. A circuit tester device for testing continuity and polarity of vehicle relay circuits coupled to a relay socket, the circuit tester device comprising:

a housing;
a battery lead carried by the housing and adapted to connect to a battery terminal;
a ground lead carried by the housing and adapted to connect to a ground;
a pair of input voltage circuits carried by the housing and connected between the battery lead and the ground lead, each of the of input voltage circuits having an input test terminal adapted to connect to a respective one of a plurality of receptacle terminals of the relay socket to receive an input voltage therefrom;
a ground circuit carried by the housing and connected between the battery lead and the ground lead, the ground circuit having a first test terminal adapted to be coupled to a vehicle circuit that has in series a vehicle switch and the ground; and
at least one load circuit carried by the housing and connected between the battery lead and the ground lead, the at least one load circuit having in series a test switch and a second test terminal adapted to be coupled to at least one other vehicle circuit.

14. The circuit tester device of claim 13, wherein the ground circuit includes in series a first resistor, a first light emitting diode, a first diode, the first ground test terminal, a second diode, a second light emitting diode and a second resistor.

15. The circuit tester device of claim 13, wherein each of the input voltage circuits includes in series a first resistor, a first light emitting diode, a first diode, the input test terminal, a second diode, a second light emitting diode and a second resistor.

16. A circuit tester device for testing continuity and polarity of vehicle relay circuits coupled to a relay socket, the circuit tester device comprising:

a housing;
a plug extending from the housing, the plug including a plurality of pins each pin being adapted to electrically connect to a respective one of a plurality of receptacle terminals of a relay socket;
a battery lead carried by the housing and adapted to connect to a battery terminal;
a ground lead carried by the housing and adapted to connect to a ground; and
a circuitry mounted within the housing and including at least three circuits connected between the battery lead and the ground lead, each of the at least three circuits including in series a first resistor, a first status indicator, a first diode, a second diode, a second status indicator and a second resistor, each of the at least three circuits further including a test terminal that is coupled between the first and second diodes and further connected to a respective one of the at least three of the pins, wherein one of the at least three circuits is an input test circuit and two of the at least three circuits are load circuits, said input test circuit containing said test terminal and two switches, said two switches each connected in series with a corresponding one of the two load circuits.

* * * * *